United States Patent [19]
Nishino

[11] Patent Number: 5,897,193
[45] Date of Patent: Apr. 27, 1999

[54] SEMICONDUCTOR WAFER

[75] Inventor: Tomoki Nishino, Kanagawa, Japan

[73] Assignee: Sony Corporation, Japan

[21] Appl. No.: 07/910,763

[22] Filed: Jul. 8, 1992

[30] Foreign Application Priority Data

Jul. 18, 1991 [JP] Japan ................................. P3-178372

[51] Int. Cl.$^6$ .................................................. H01L 23/52
[52] U.S. Cl. .......................... 257/691; 257/665; 257/698; 257/773
[58] Field of Search ................................... 257/735, 741, 257/773, 665, 691, 698

[56] References Cited

U.S. PATENT DOCUMENTS

| | | | |
|---|---|---|---|
| 4,381,602 | 5/1983 | McIver | 29/840 |
| 4,679,088 | 7/1987 | Chiyoma et al. | 358/213.18 |
| 4,722,060 | 1/1988 | Quinn et al. | 257/672 |
| 4,847,732 | 7/1989 | Stopper et al. | 361/395 |
| 4,942,453 | 7/1990 | Ishida et al. | 357/68 |
| 5,036,380 | 7/1991 | Chase | 357/70 |
| 5,117,277 | 5/1992 | Yuyama et al. | 357/71 |

*Primary Examiner*—Valencia Martin-Wallace
*Attorney, Agent, or Firm*—Ronald P. Kananen; Rader, Fishman & Grauer

[57] ABSTRACT

A semiconductor wafer is arranged so that a burn-in test, which is performed to remove latent defects, can be conducted while the semiconductor chips are still on the semiconductor wafer. Sets of pad electrodes necessary for the burn-in test of the semiconductor chips are provided on each of the semiconductor wafers and are connected to external pad electrodes formed at a peripheral portion of the semiconductor wafer, by way of metal film wiring lines. High resistance polycrystalline silicone thin film wiring line portions which acts as fuses, and low resistance polycrystalline silicon wiring line portions which are cleanly cut upon dicing, are provided at a suitable intermediate location in the metal thin filming lines.

9 Claims, 6 Drawing Sheets

FIG. I

SEMICONDUCTOR WAFER

BACKGROUND OF THE INVENTION

1. Field of the Invention

This invention relates to a semiconductor safer therein pad electrodes necessary for a burn-in test of all semiconductor chips on the semiconductor safer are electrically connected to external terminal pad electrodes formed on a peripheral portion of the semiconductor wafer.

2. Description of the Prior Art

In recent years, high integration and miniaturization of semiconductor elements have proceeded dramatically. As a result of this high integration and miniaturization, the film thickness of semiconductor elements and the thickness of metal film wiring lines have become greatly reduced. This gives rise to a serious problem with respect to the reliability of the semiconductor elements and also to the removal of latent defects which appear during initial use in order to resolve these problems, it is a common practice to perform a so-called burn-in test wherein a stress such wherein a voltage is applied to the semiconductor elements under elevated temperature conditions to accelerate the conversion of latent defect into an actual existence.

Such burn-in tests are normally performed in accordance either with a first testing form Viz., a condition wherein a test is performed by inserting a single semiconductor device in a completed condition, wherein semiconductor chips are separated from one another and individually enclosed in a resin material into a socket mounted on a printed circuit board especially designed for use in burn-in tests. Alternatively, the completed chips are subjected to a second testing format wherein tests are performed using a burn-in testing pattern formed on a TAB (Tape Automated Bonding) tape. This latter-mentioned testing is used in order to perform a burn-in test on semiconductor chips mounted on a TCP (Tape Carrier Package).

The first testing technique described above suffers from drawbacks of the nature described below. First as the production of semiconductor devices increases, the cost of burning boards each having a socket mounted on a printed circuit board increases remarkably. Further, a great number of man-hours is required for mounting and dismounting of a semiconductor device on the burn-in board, and in many cases, a new apparatus exclusively for such mounting and dismounting is required Further, when a semiconductor device is mounted or dismounted, deformation of the external terminal leads is invited. This tends to bring about a nonsoldered condition and is a principal cause of onto defects when the semiconductor devices are soldered onto printed circuit boards using a surface mounting solder reflow technique Additionally, since the separate semiconductor chips on a semiconductor wafer are tested as individual semiconductor devices, the ability to ascertain the existence of burn-in defects which existed when semiconductor chips and the like were still on the semiconductor wafer is greatly reduced. This inhibits the accumulation of data which are useful in improving in semiconductor wafer manufacturing techniques. Consequently, it has been difficult to enhance the yield and the reliability of semiconductor wafers.

The second testing form wherein a burning test is performed for semiconductor chips mounted on a TCP has also suffered from drawbacks of the nature described below. In particular, a TAB tape used in this test has a length of up to about 20 m, and a burn-in apparatus is required to have a sufficient size to allow such long TAB tape to be accommodated therein. Consequently, the burn-in apparatus has a very large size. In order to reduce the size of the burn-in apparatus. it is necessary to out such TAB3 tape for several semiconductor chips. However, if a TAB3 tape is cut in this manner, then automation of the mounting step, which is a characteristic of the TAB technique, cannot be achieved.

Further, when a socket for a TCP is used, since there are many various outer profiles of custom specifications for such TCP, the socket cannot be used commonly, and if expansion of a TAB tape in a heated condition during a burn-in test is taken into consideration, it is very difficult to achieve accurate positioning between terminals of the socket and TAB leads over the length of about 20 m.

In addition, even if a burn-in power source pattern is provided on a TAB tape so as to allow a burn-in test to be performed. Input clocks cannot be supplied for dynamic burn-in wherein specimens of a semiconductor device are operated dynamically. Consequently the burn-in test is limited only to static burn-in. Accordingly, an optimal burn-in cannot be achieved.

SUMMARY OF THE INVENTION

It is an object of the present invention to provide a semiconductor wafer which eliminates the necessity for burn-in tests to be carried out in the manner described above wherein the semiconductor chips are assembled into a transfer mold packages or mounted onto a TCP, and which therefore reduces the cost required for burn-in tests.

It is another object of the present invention to provide a semiconductor wafer which minimizes the latent defect ratio of semiconductor chips and enables the occurrence of burn-in defects (latent defects) while the semiconductor chips remain on the semiconductor wafer, to be ascertained.

In order to attain the object, according to the present invention, there is provided a semiconductor wafer in which a plurality of semiconductor chips are formed, a pair of pad electrodes formed on each of the semiconductor chips, a pair of external terminal electrode pads formed on an outer peripheral portion of the semiconductor wafer, and a plurality of metal film wiring lines made of the same material as the pad electrodes which are connected to the external terminal pad electrodes for supplying a test signal or voltage to all of the semiconductor chips on the semiconductor wafer.

Preferably, the semiconductor wafer further comprises a fuse element disposed between one of a power supply wiring line and a grounding wiring line included in the metal film wiring lines and one of a power supply pad electrode and a grounding pad electrode formed on each of the semiconductor chips. The fuse element is arranged to be broken cut by an excess current flowing therethrough. Preferably, the fuse element is made of polycrystalline silicon having a high resistance while the metal film wiring lines are made of aluminum.

Preferably, each of the metal film wiring lines is cut at a location at which it crosses a separating zone between adjacent semiconductor chips and the ends of the thus cut metal film wiring line segments are connected by way wiring line of a material different from the material of the metal film wiring lines. At each location at which the metal film wiring lines cross each other, a portion of one of the two metal film wiring lines is made of a material such as polycrystalline silicon having a low resistance.

Preferably, the external terminal electrode pads which make ends of the metal film wiring lines are formed in a peripheral area of the semiconductor wafer where no semiconductor chip can be completely formed.

With the semiconductor wafer according to the present invention a burn-in test can be performed while the semiconductor chips are still on the semiconductor wafer. Consequently, a burn-in test which is performed after assembly of the semiconductor chips to a transfer mold package or packages or after mounting of the semiconductor chips onto a TCP in order to remove a latent defect of the semiconductor chips is eliminated, and accordingly, the cost of a burn-in test, which is conventionally performed at the assembly step or the mounting step, is reduced. As a result the latent defect ratio can be notably suppressed as compared with conventional techniques. Further, it becomes possible to ascertain the a tendency for burn-in defects (latent defects) to occur while the semiconductor chips remain on the semiconductor safer. Consequently, the yield and the reliability of semiconductor wafers can be enhanced and stabilized rapidly. The possible deformation of external terminal leads of the semiconductor device in a burn-in test can also be eliminated.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
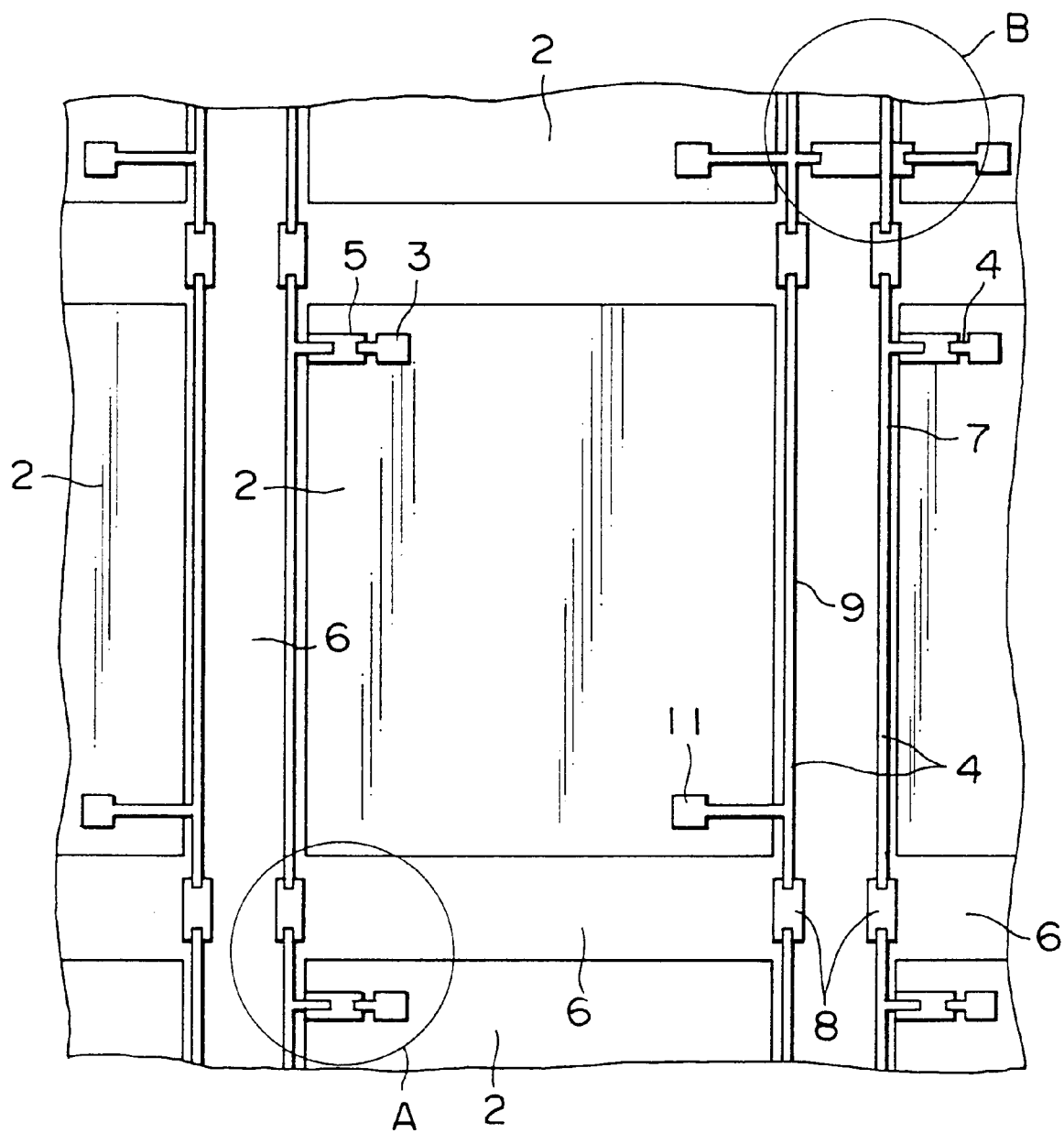
FIG. 1 is a top plan view of a semiconductor chip and associated elements on a semiconductor wafer according to a first preferred embodiment of the present invention.

Referring first to FIG. 1, there are shown a semiconductor chip and associated elements on a semiconductor wafer to which the present invention is applied. A metal wiring film 4 of an aluminum alloy is led out from a power supply pad electrode 3 on a semiconductor chip 2 formed on a semiconductor wafer 1 (FIG. 3) and is connected by day of a high resistance polycrystalline silicon thin film wiring line or portion 5 of a comparatively high resistance to another metal film wiring line 4 which is made of the same material as the power supply pad electrode 3. This functions as a power supply bus line 7. The metal film wiring line 4 is formed in the proximity of an and portion of and extends in parallel to a separating zone or scribe line 6 which separates the semiconductor chip 2 from another adjacent semiconductor chip 2.

Figure 3:
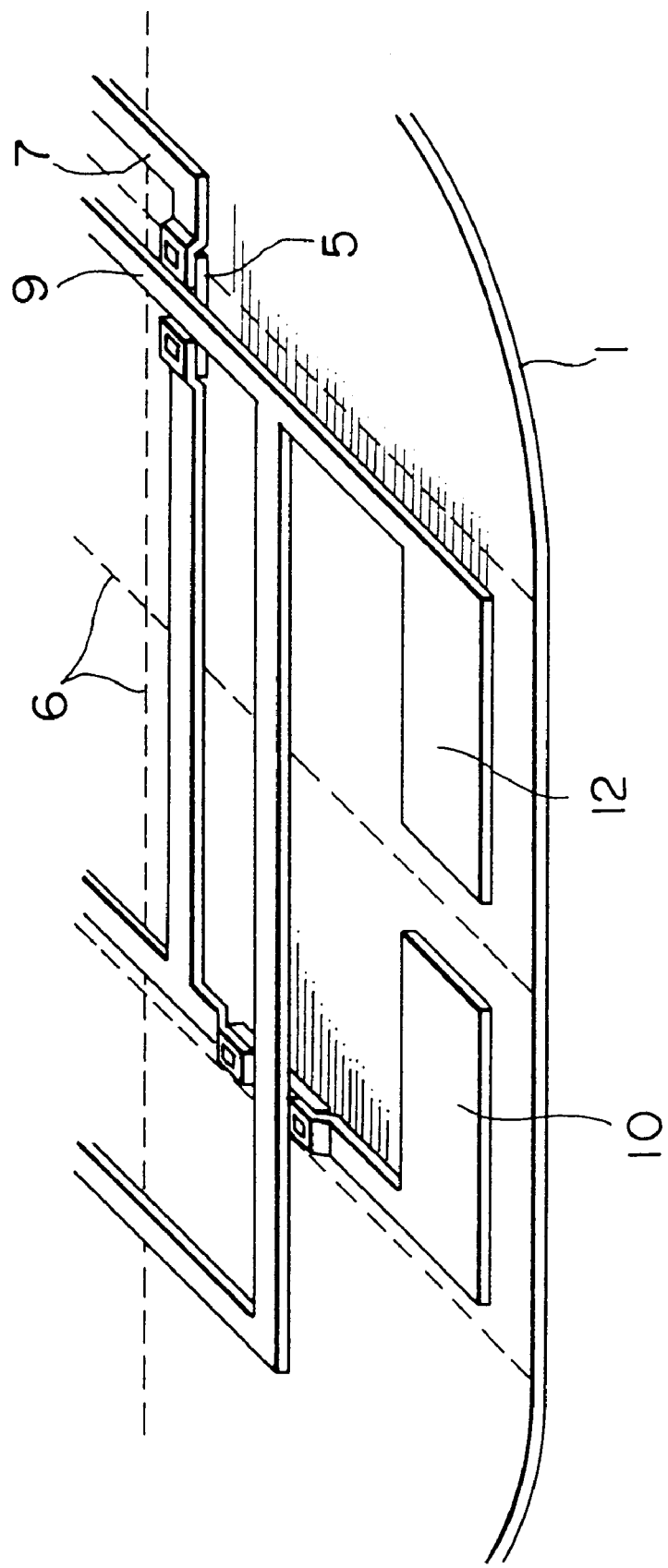
FIG. 3 is a partial enlarged perspective view showing details of an external terminal pad electrode on the semiconductor wafer of FIG. 1 by way of which a signal or voltage is supplied from the outside to the semiconductor chips.

The power supply bus line 7 is connected, at a location where it crosses another scribe line 6 extending perpendicularly thereto, to another power supply bus line 7 by way of a low resistance polycrystalline silicon thin film wiring line or portion 8 of a comparatively low resistance. The power supply bus lines 7 connected in series in this manner are connected to a power supply external terminal pad electrode 10 as shown in FIGS. 1 and 3. The power supply external terminal pad electrode 10 is formed at an arbitrary location in an area at a peripheral portion of the semiconductor wafer 1 in which a complete semiconductor chip 2 cannot be formed. The power supply external terminal pad electrode 10 is isolated from any element therearound by an oxide film of $S_1O_2$.

Meanwhile, a grounding pad electrode 11 on the semiconductor chip 2 is similarly connected to a grounding external terminal pad electrode 12 formed in the peripheral portion of the semiconductor wafer 1 by way of grounding bus lines 9. These bus lines 9 are made of the same material as the grounding pad electrodes 11 and are each formed in the proximity of an and of the scribe line 6 on the opposite side of the semiconductor chip 2 in an opposing relationship to the power supply bus lines 7. A low resistance polycrystalline silicon thin film 8 is interposed between each adjacent end of the grounding bus lines 9 at a location at which they cross a subscribe line 6 extending perpendicularly thereto. However, no high resistance polycrystalline silicon thin file wiring line portion 5 is disposed in the metal film wiring line 4 which extends from the grounding pad electrode 11 for the reason described below.

Figure 2:
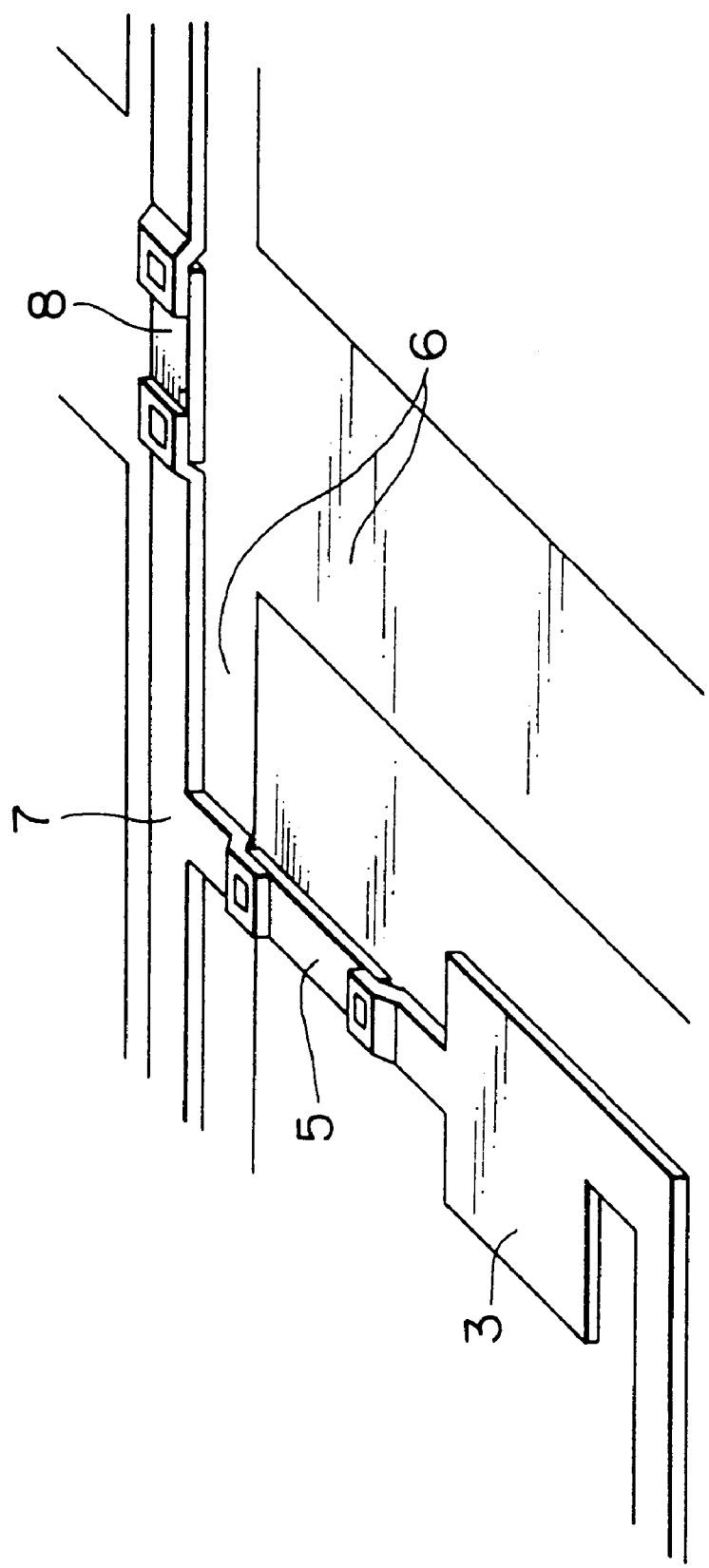
FIG. 2 is an enlarged perspective view showing details of a portion A of FIG. 1.

The high resistance polycrystalline silicon thin file wiring line 5 and the low resistance polycrystalline silicon thin film wiring line 8 are disposed in such a manner as shown in FIG. 2. As shown in this figure the high resistance polycrystalline silicon thin film wiring line portion 5 acts as a fuse which is cut by Joule heat when an excess current flows therethrough. The function provides an affect that, when the semiconductor chip 2 fails during a burn-In test and a high current flows therethrough, the high resistance polycrystalline silicon thin film wiring layer 5 acts like a fuse and disconnects the failed chip from the burn-in testing circuit. Another function resides in that, in case the semiconductor chip 2 is rejected by a wafer probing test which is performed before the burn-in test, an excess current is deliberately supplied to the semiconductor chip 2 at the final stage of the wafer probing test to cut the high resistance polycrystalline silicon thin film wiring line portions 5 so that the failed portion is disconnected in advance from the burn-in testing circuit.

The low resistance polycrystalline thin film wiring line portion 8 does not exhibit any fuse-like function as different from the high resistance polycrystalline silicon thin film wiring line portion 5, and the affect of the construction is such that metallic whiskers which may contact, upon wire bonding at a later stage, with a bonding wire to cause short circuiting are not produced. More specifically, when the semiconductor wafer 1 is cut at a central portion of the scribe line 6 by means of a dicing blade not shown) in order to separate the individual semiconductor chips 2 from one another, metallic whiskers or the like may be produced by the aluminum alley since the aluminum alloy has a high drawing property and is not cut readily by the dicing blade. However, with the construction described above, whiskers of the nature described above are not produced because the low resistance polycrystalline silicon thin film wiring line portion 8 does not exhibit a high drawing property and is brittle. Consequently, it can be cut cleanly by a dicing blade.

The high resistance polycrystalline silicon thin film wiring line portion 5 at the location at which it crosses the scribe line 6 is used also as a jumper line as seen at B in FIG. 1. It is also used as a jumper line where the grounding bus line 9 and the power supply bus line 7 cross in the manner shown in FIG. 3. It should be noted that the same function is achieved if connection is established by way of a bonding wire of the nail-head type or a bonding wire of the wedge type, or by way of a diffused layer (doped region) in place of the high resistance polycrystalline silicon thin film wiring line portion 5.

Figure 4:
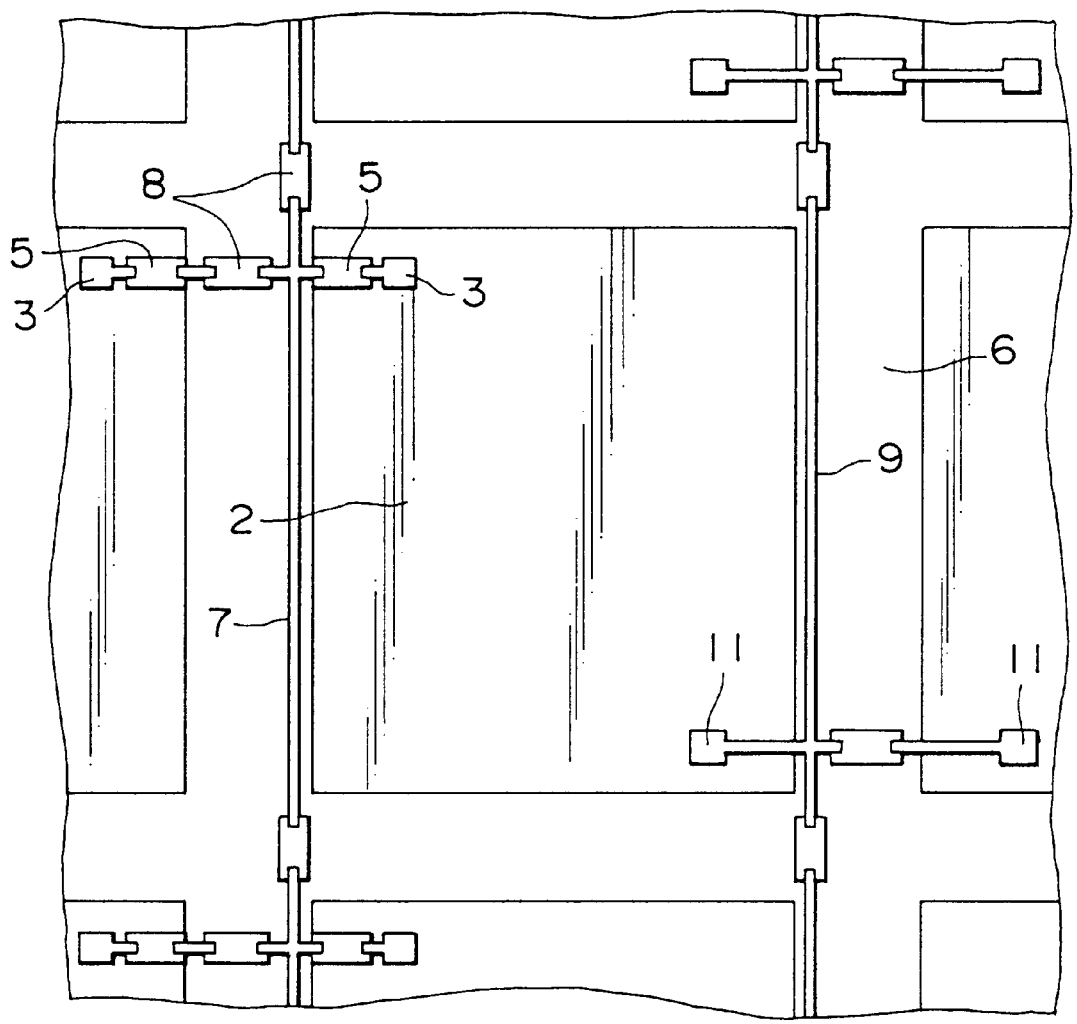
FIG. 4 is a top plan view of a semiconductor chip and associated elements of another semiconductor wafer according to a second preferred embodiment of the present invention.

Referring now to FIG. 4, there are shown a semiconductor chip and associated elements on a semiconductor wafer according to a second preferred embodiment of the present invention. In this arrangement shown a pair of semiconductor chips 2 having patterns symmetrical with each other with respect to a scribe line 6 which extends between them, are formed on a semiconductor wafer 1. With this arrangement, the number of patterns on the scribe line 6 is reduced as compared with the arrangement shown in FIG. 1, and is effective in reducing the width of the scribe line 6.

Figure 5:
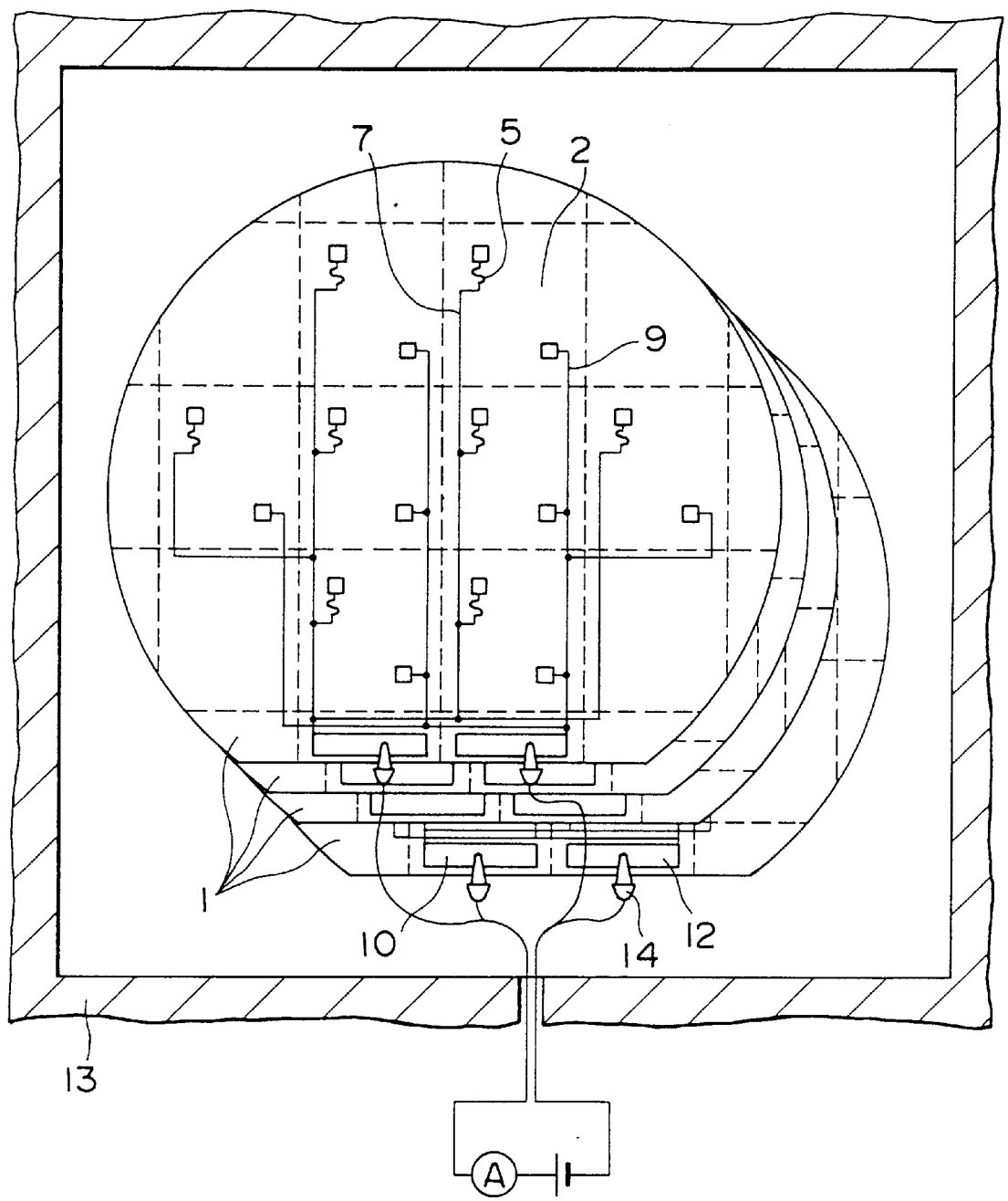
FIG. 5 is a schematic view illustrating a static burn-in test being performed for a semiconductor wafer of the present invention.

The measuring methods applied to a semiconductor chip 2 on a semiconductor wafer in accordance with the present invention are described with reference to FIGS. 5 and 6. Referring first to FIG. 5, a plurality of semiconductor wafers for which a static burn-in test is being performed, are shown. The plurality of semiconductor wafers 1 are set in position in a wafer holder (not shown) accommodated in an air-conditioned tank 13. Alligator clips 14 having an insulated rear face are connected to the power supply external terminal pad electrodes 10 and the grounding external terminal pads 12. Power is supplied to the alligator clips 14 from outside of the air-conditioned tank 13 by way of a wiring cable.

Figure 6:
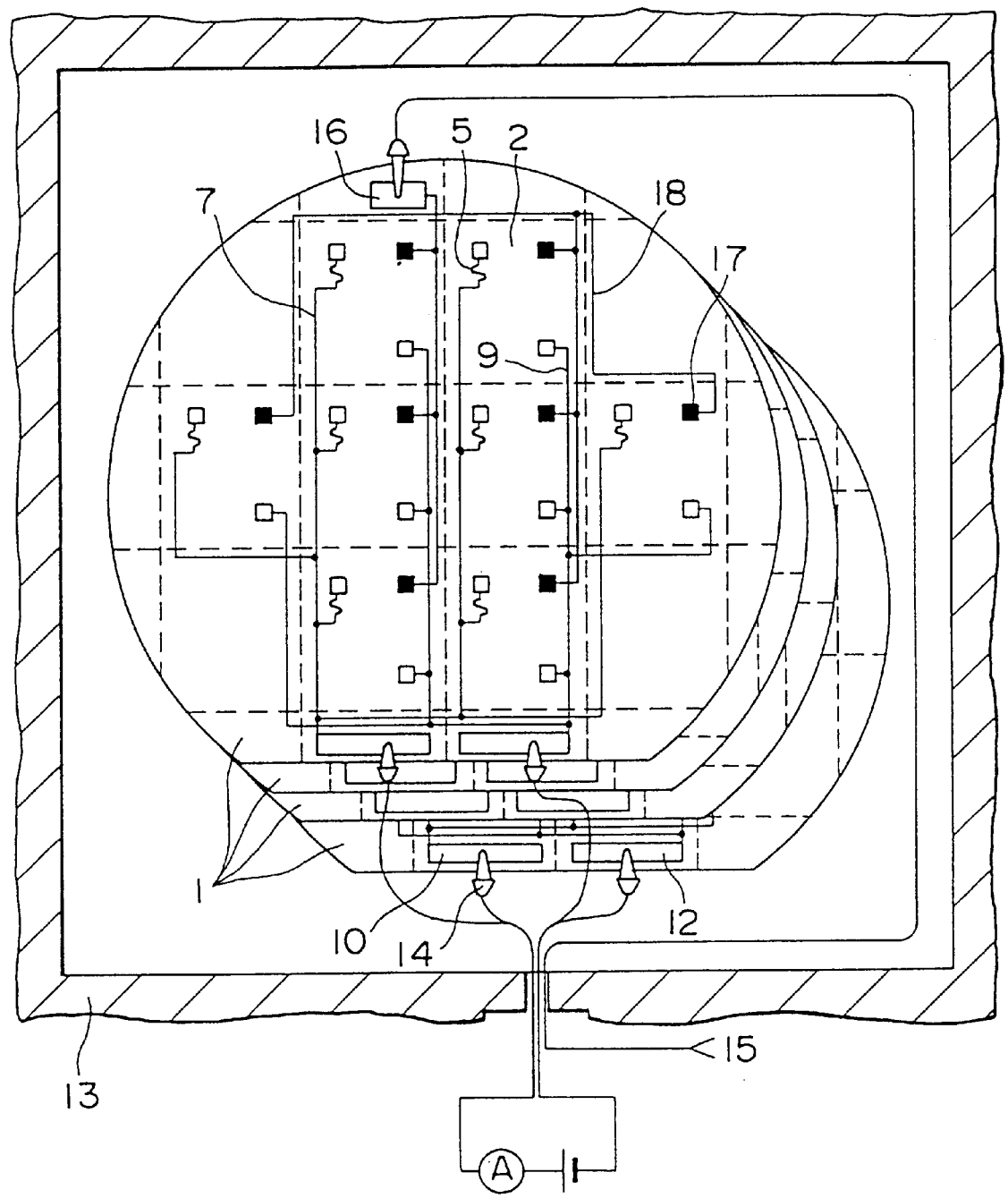
FIG. 6 is a similar view but illustrating a dynamic burn-in test being performed for a semiconductor wafer of the present invention.

Referring now to FIG. 6, there are shown semiconductor wafers for which a dynamic burn-in test is being performed using the same testing equipment. In the condition shown, an external input clock signal is applied to semiconductor wafers 1 to induce the semiconductor chips 2 on the semiconductor wafers 1 to assume an operative condition while the burn-in test is performed. In the condition shown in FIG. 6C. In order to perform dynamic burn-in, a wiring cable for the input clock signal is connected, in addition to the wiring cable for the power supply, from the outside of the aircondtioned tank 13 to the semiconductor wafers 1. Each of the semiconductor wafers 1 has an external terminal pad electrode 16 for the input of the clock signal and a bus line 18 for conducting the clock signal to each of the chips 2. The input clock signal bus line 18 is connected to pad electrodes 17 which are formed on each semiconductor chip 2.

As described with a semiconductor wafer according to the present invention, a burn-in test can be simultaneously performed for a plurality of semiconductor wafers before semiconductor chips are cut from the semiconductor wafers. Consequently, a burn-in test can be performed for a large number of semiconductor chips efficiently at a time.

What is claimed is:

1. A semiconductor wafer, comprising:
   a plurality of semiconductor chips formed in said semiconductor wafer;
   a pair of supply and ground pad electrodes formed on each of said semiconductor chips;
   a pair of external supply and ground terminal electrode pads formed on an outer peripheral portion of said semiconductor wafer;
   a power supply bus line and a ground bus line which are made of the same material as said pad electrodes, which are formed on said semiconductor wafer and which respectively interconnect said external supply and ground terminal electrode pads and each of said supply and ground pad electrodes on each of said semiconductor chips for simultaneously supplying an identical signal or voltage to all of said semiconductor chips on said semiconductor wafer; and
   separating zones which are defined in said semiconductor wafer and which separate each of said semiconductor chips from one another, and wherein said power supply bus line and said ground bus line includes a plurality of low resistance portions each disposed in a separating zone between adjacent semiconductor chips, said low resistance portions being formed of a material which is different from the material from which said power bus supply line and said ground bus line are formed and which facilitates cutting of said wafer into blocks which each include a semiconductor chip.

2. A semiconductor wafer, comprising:
   a plurality of semiconductor chips formed in said semiconductor wafer;
   a pair of supply and ground pad electrodes formed on each of said semiconductor chips;
   a pair of external supply and ground terminal electrode pads formed on an outer peripheral portion of said semiconductor wafer;
   a power supply bus line and a ground bus line which are made of the same material as said pad electrodes, which are formed on said semiconductor wafer and which respectively interconnect said external supply and ground terminal electrode pads and each of said supply and ground pad electrodes on each of said semiconductor chips for simultaneously supplying an identical signal or voltage to all of said semiconductor chips on said semiconductor wafer; and
   a plurality of fuse elements electrically interposed between one of said power supply bus line and said ground bus line and the corresponding plurality of said supply and ground pad electrodes on each of said semiconductor chips, said fuse element being arranged to be broken by a current in an excess of a predetermined current flowing therethrough.

3. A semiconductor wafer as claimed in claim 2, wherein said plurality fuse elements is made of polycrystalline silicon having a high resistance.

4. A semiconductor wafer as claimed in claim 1, wherein said power supply bus and ground bus lines are made of aluminum and said plurality of low resistance members is made of a polycrystalline silicon having a low electrical resistance.

5. A semiconductor wafer as claimed in claim 1, wherein said external terminal electrode pads are formed in a peripheral area of said semiconductor wafer which is isolated at an outer periphery thereof.

6. A semiconductor wafer as claimed in claim 1, wherein said power supply bus line and said ground bus line cross over one another, and wherein said power supply bus line and said ground bus line are formed of a first material and wherein one of said power supply bus line and said ground bus line includes a portion which is made of a second material which is different from the first material, said portion being located at the site where said power supply bus line and said ground bus line cross and supporting the one of said power supply bus line and said ground bus line in which said portion is absent.

7. A semiconductor wafer including a test arrangement for testing a plurality of semiconductor chips formed in said semiconductor wafer, comprising;

a pair of supply and ground pad electrodes formed on each of said semiconductor chips;

a pair of external supply and ground terminal electrode pads formed on an outer peripheral portion of said semiconductor wafer;

a power supply bus line means and a ground bus line means which are respectively formed on said semiconductor wafer for respectively interconnecting said external supply and ground terminal electrode pads and each of said supply and ground pad electrodes on each of said semiconductor chips so that each of said semiconductor chips can be simultaneously supplied with a test signal; and a plurality of fuse means which are each respectively interposed between one of said power supply bus means and said ground bus means and one of said semiconductor chips, for fusing in response to a current in excess of a predetermined level passing therethrough.

8. A semiconductor wafer including a test arrangement for testing a plurality of semiconductive chips formed in said semiconductor wafer, comprising;

a pair of supply and ground pad electrodes formed on each of said semiconductor chips;

a pair of external supply and ground terminal electrode pads formed on an outer peripheral portion of said semiconductor wafer; and a power supply bus line means and a ground bus line means which are respectively formed on said semiconductor wafer for respectively interconnecting said external supply and ground terminal electrode pads and each of said supply and ground pad electrodes on each of said semiconductor chips so that each of said semiconductor chips can be simultaneously supplied with a test signal;

wherein said power supply bus means and said ground bus means each comprise: a plurality of portions which are formed of a low electrical resistance material, which can be cut cleanly, and which are located in locations between adjacent chips in which cuts are made to separate said plurality of semiconductor chips from one another.

9. A semiconductor wafer including a test arrangement for testing a plurality of semiconductive chips formed in said semiconductor wafer, as set forth in claim 7, wherein said power supply bus means and said ground bus means are predominantly formed of metal film.

* * * * *